United States Patent [19]
Kassai et al.

[11] Patent Number: 5,771,893
[45] Date of Patent: Jun. 30, 1998

[54] METHOD AND APPARATUS FOR NUCLEAR MAGNETIC RESONANCE IMAGING OF PHYSIOLOGICAL FUNCTION INFORMATION

[75] Inventors: Yoshimori Kassai, Tochigi-ken; Shoichi Kanayama, Saitama-ken; Shigehide Kuhara; Arturo Calderon, both of Kanagawa-ken, all of Japan

[73] Assignee: Kabushiki Kaisha Toshiba, Kawasaki, Japan

[21] Appl. No.: 524,257

[22] Filed: Sep. 6, 1995

[30] Foreign Application Priority Data

Sep. 6, 1994 [JP] Japan .................................. 6-212984

[51] Int. Cl.$^6$ ................................................ A61B 5/055
[52] U.S. Cl. ................................ 128/653.3; 324/306
[58] Field of Search ............................. 128/653.2, 653.3; 324/306, 307, 309

[56] References Cited

U.S. PATENT DOCUMENTS

| | | | |
|---|---|---|---|
| 4,621,234 | 11/1986 | Caprhan | 324/306 |
| 5,199,435 | 4/1993 | Sugimoto et al. | 128/653.3 |
| 5,218,532 | 6/1993 | Mori | 128/653.2 |
| 5,221,898 | 6/1993 | Takiguchi et al. | 324/306 |
| 5,320,099 | 6/1994 | Roberts et al. | 128/653.3 |
| 5,521,502 | 5/1996 | Siegel, Jr. et al. | 128/653.2 |
| 5,561,370 | 10/1996 | Fuderer | 324/309 |
| 5,565,777 | 10/1996 | Kanayama et al. | 324/309 |

*Primary Examiner*—Brian L. Casler
*Attorney, Agent, or Firm*—Oblon, Spivak, McClelland, Maier & Neustadt, P.C.

[57] ABSTRACT

A nuclear magnetic resonance imaging scheme suitable for an imaging of a physiological function information on a living body. The scheme uses a pulse sequence for realizing a first imaging scheme for obtaining the blood vessel image and a second imaging scheme for obtaining the physiological function image such as a brain function image by a single execution of the pulse sequence, where the first imaging scheme is executed before the second imaging scheme by controlling resolutions and imaging regions for the respective imaging schemes appropriately. The pulse sequence can also realize a third imaging scheme for obtaining the physical shape image, which is to be executed between the first imaging scheme and the second imaging scheme. The physiological function image can be obtained by selecting valid data from the image data acquired with/without stimulation or load by using the t-test, and determining active portions from the selected valid data by using the paired t-test. The physiological function image can then be displayed in superposition with the blood vessel image and/or the physical shape image.

20 Claims, 14 Drawing Sheets

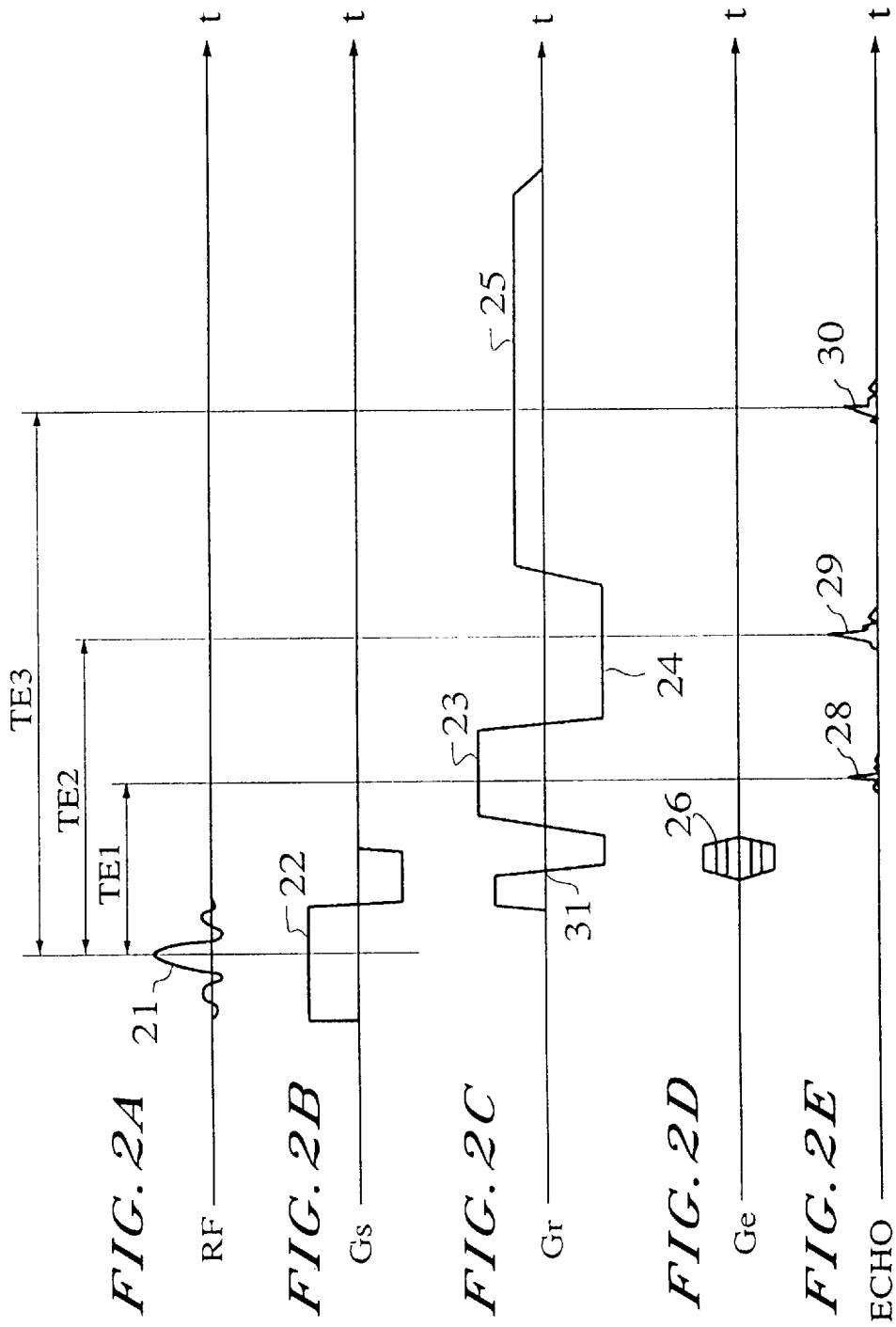

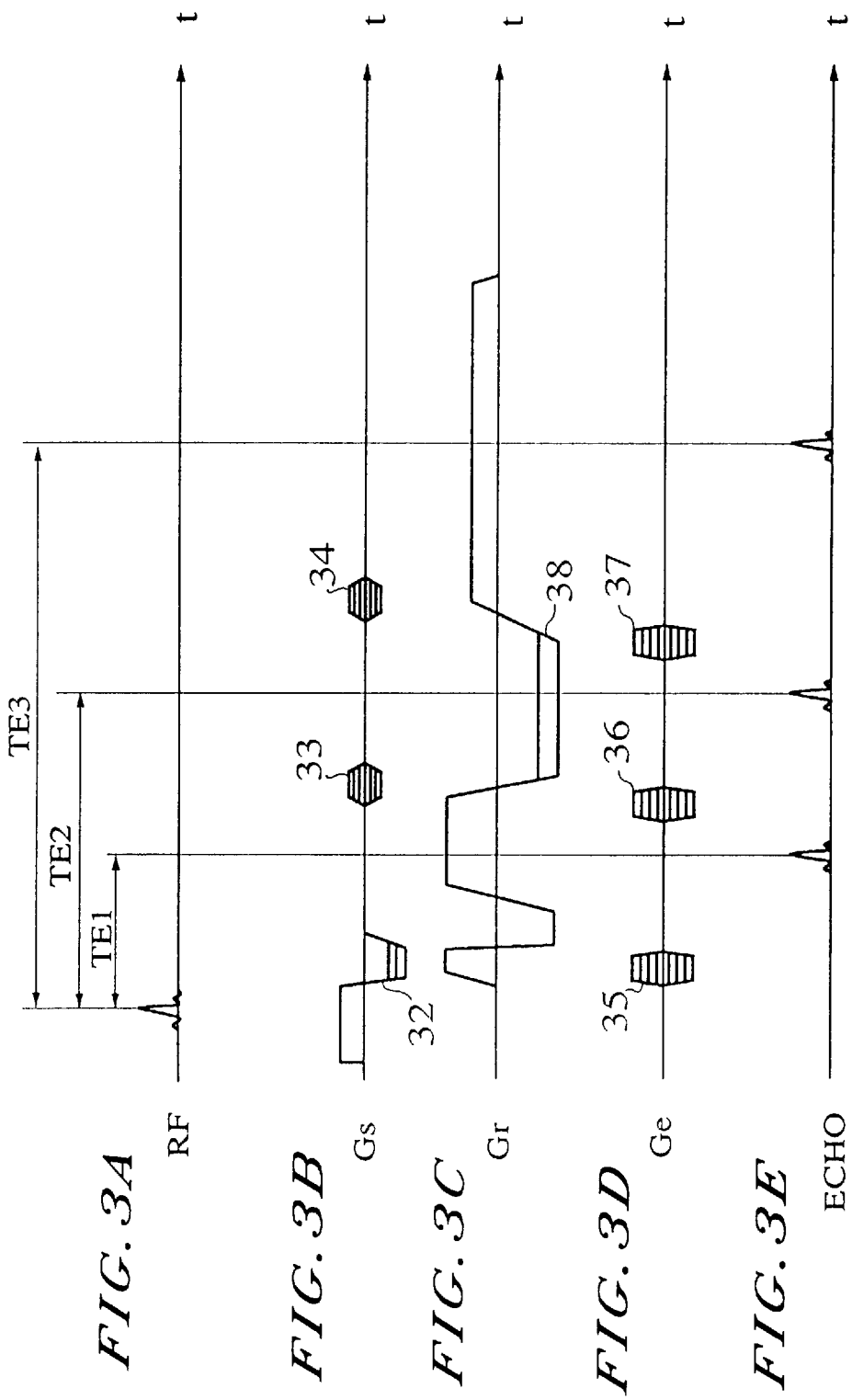

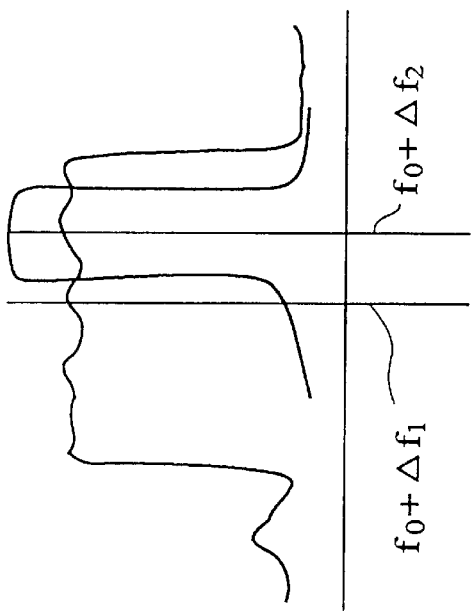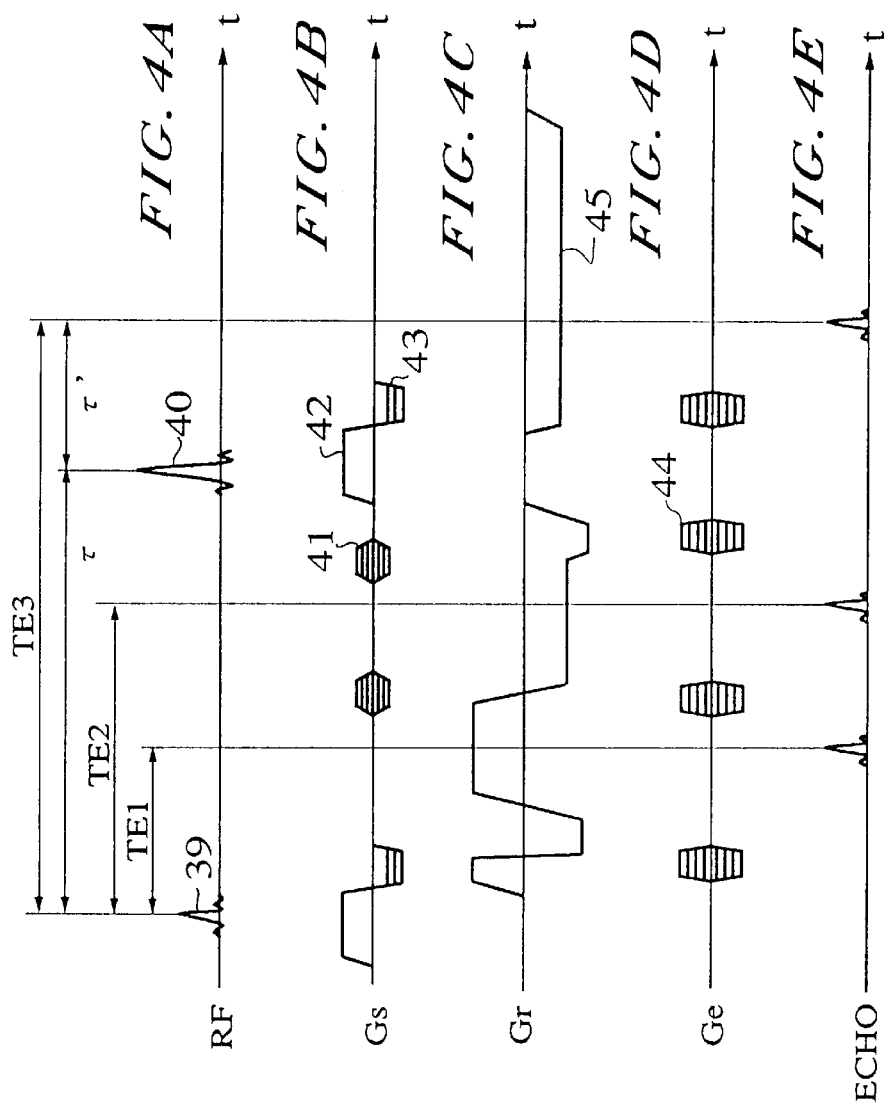

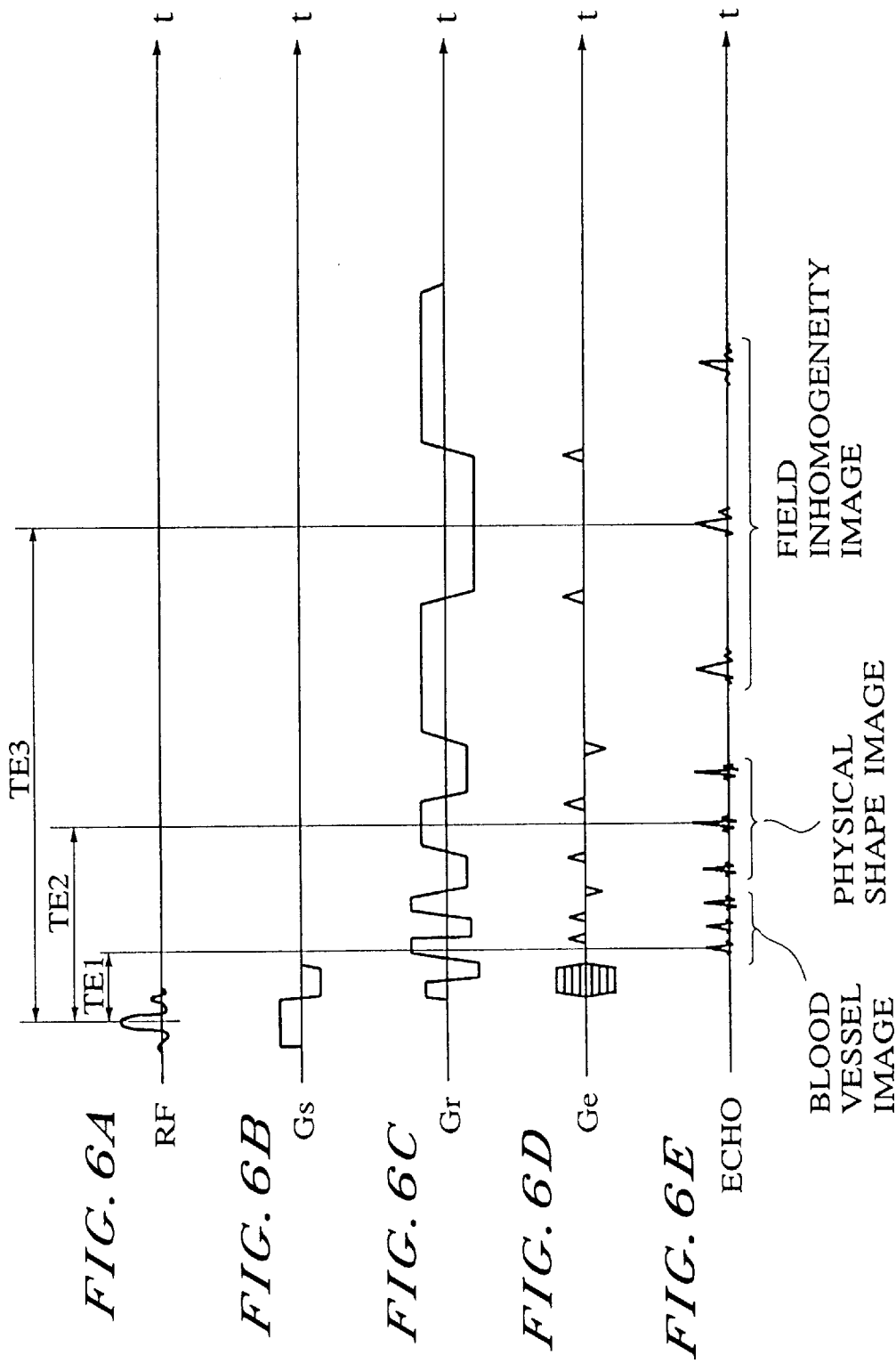

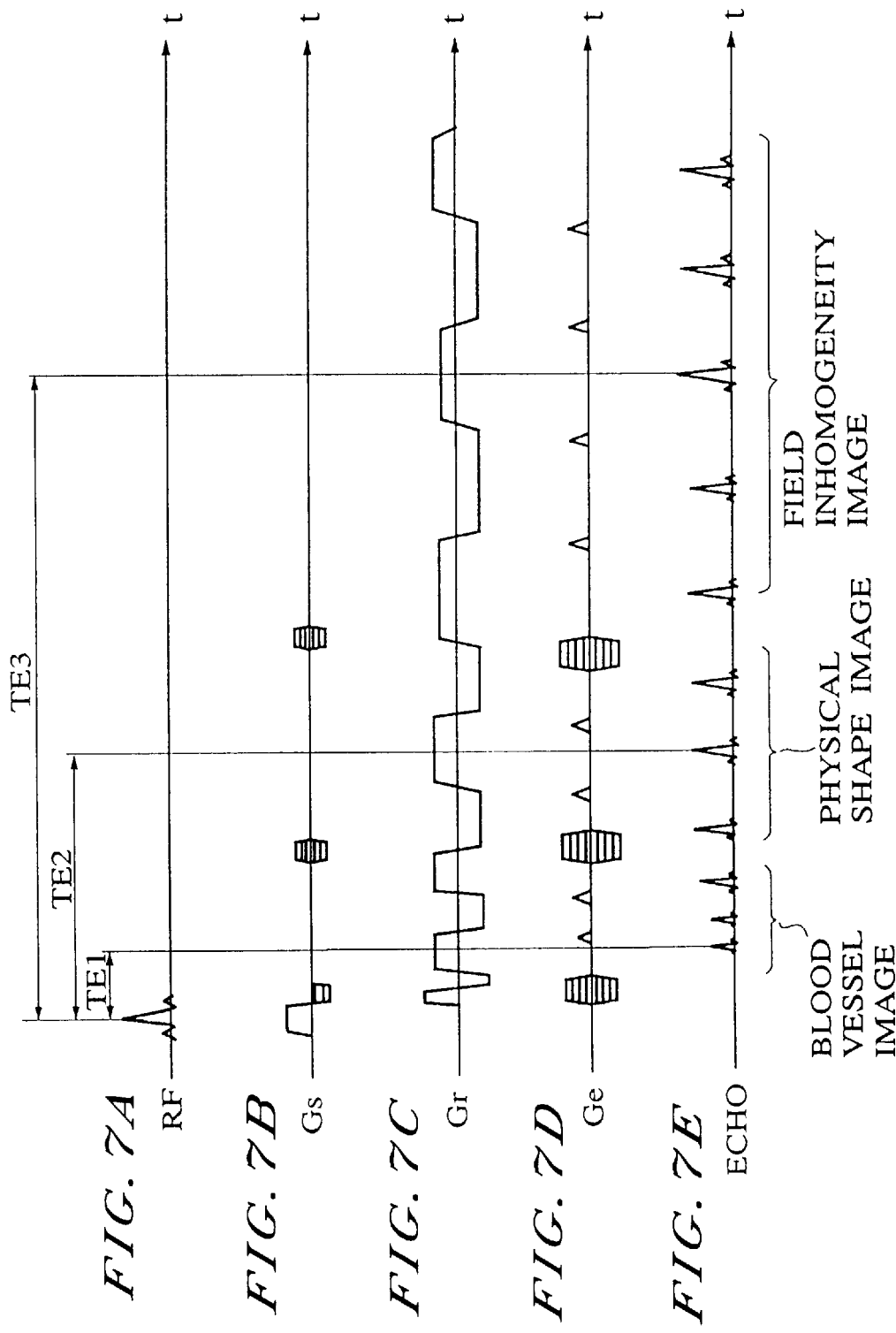

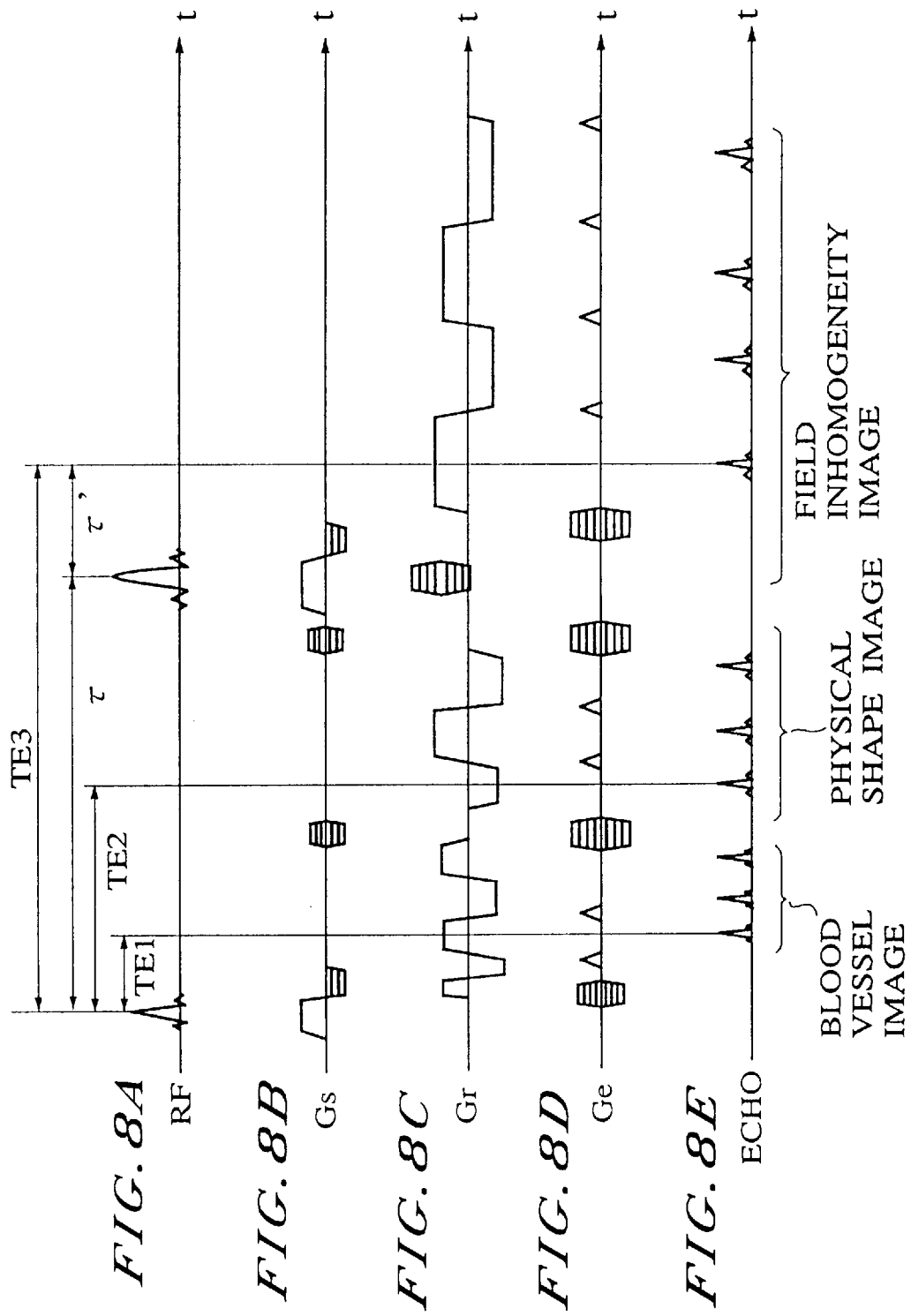

FIG.9

|  | BLOOD VESSEL IMAGE | PHYSICAL SHAPE IMAGE | BRAIN FUNCTION IMAGE |
|---|---|---|---|
| NUMBER OF PIXELS IN READING DIRECTION | 192 | 256 | 128 |
| NUMBER OF PHASE ENCODING STEPS | 128 | 256 | 128 |
| IMAGING RANGE IN SLICING DIRECTION | 120mm | 120mm | 40mm |
| NUMBER OF SLICE STEPS | 64 | 64 | 8 |
| TIME RESOLUTION | 1 | 1 | 16 |
| NUMBER OF AVERAGING TIMES | 2 | 1 | 1 |

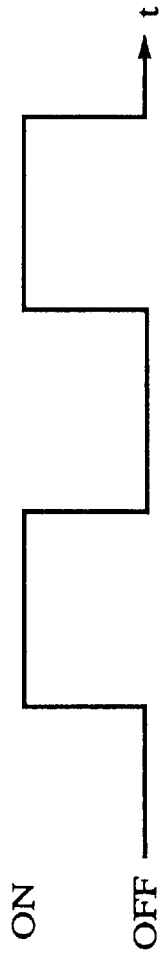
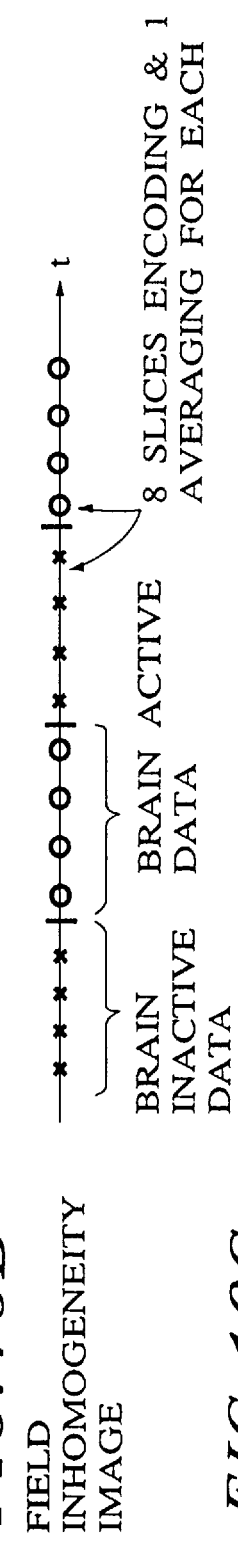
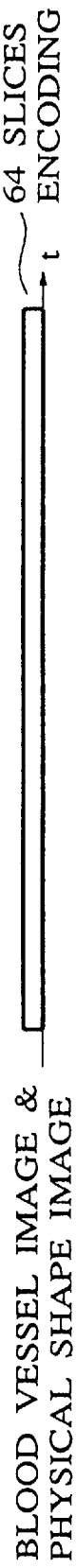
FIG. 10A BRAIN FUNCTION STIMULATION
FIG. 10B FIELD INHOMOGENEITY IMAGE
FIG. 10C BLOOD VESSEL IMAGE & PHYSICAL SHAPE IMAGE

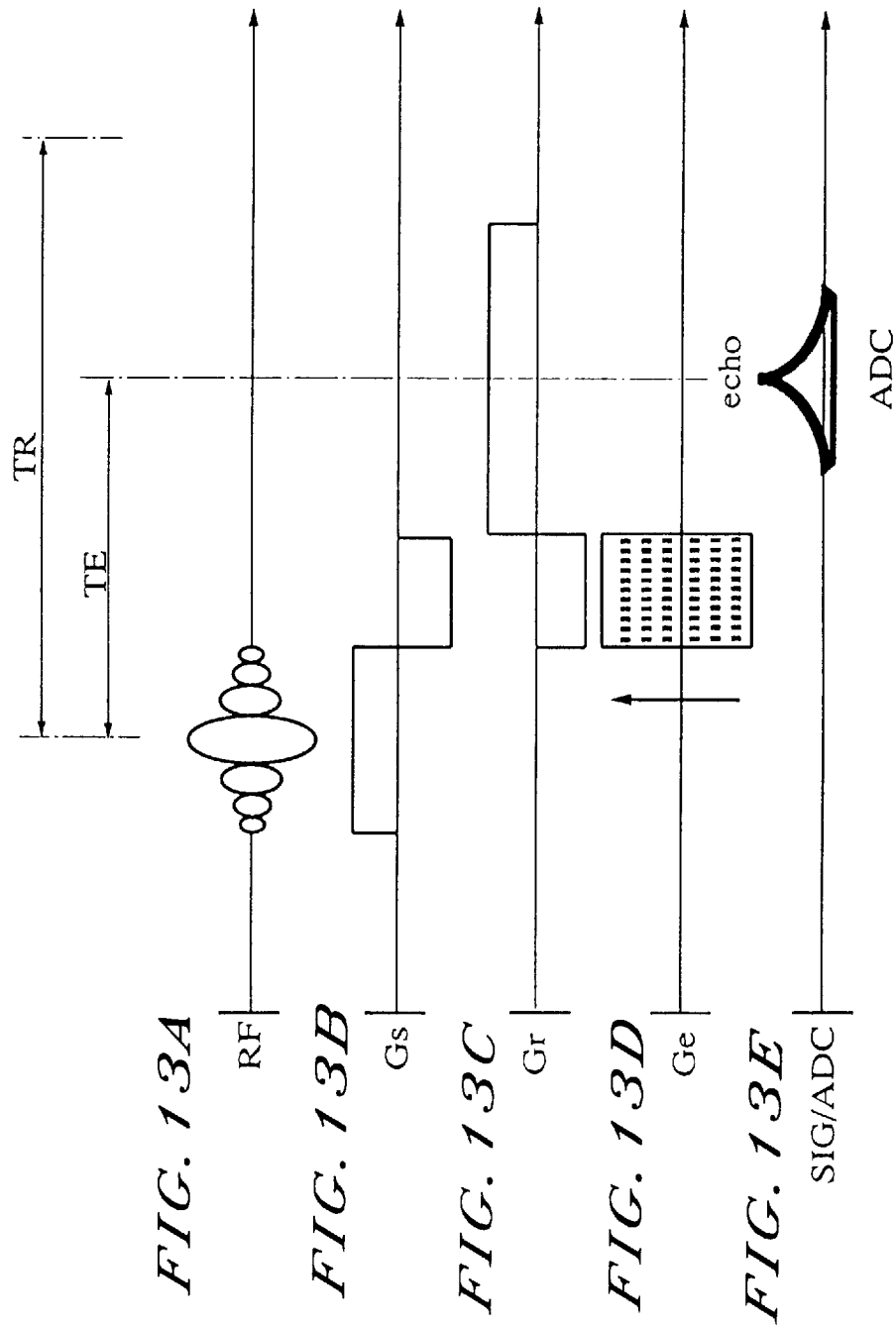

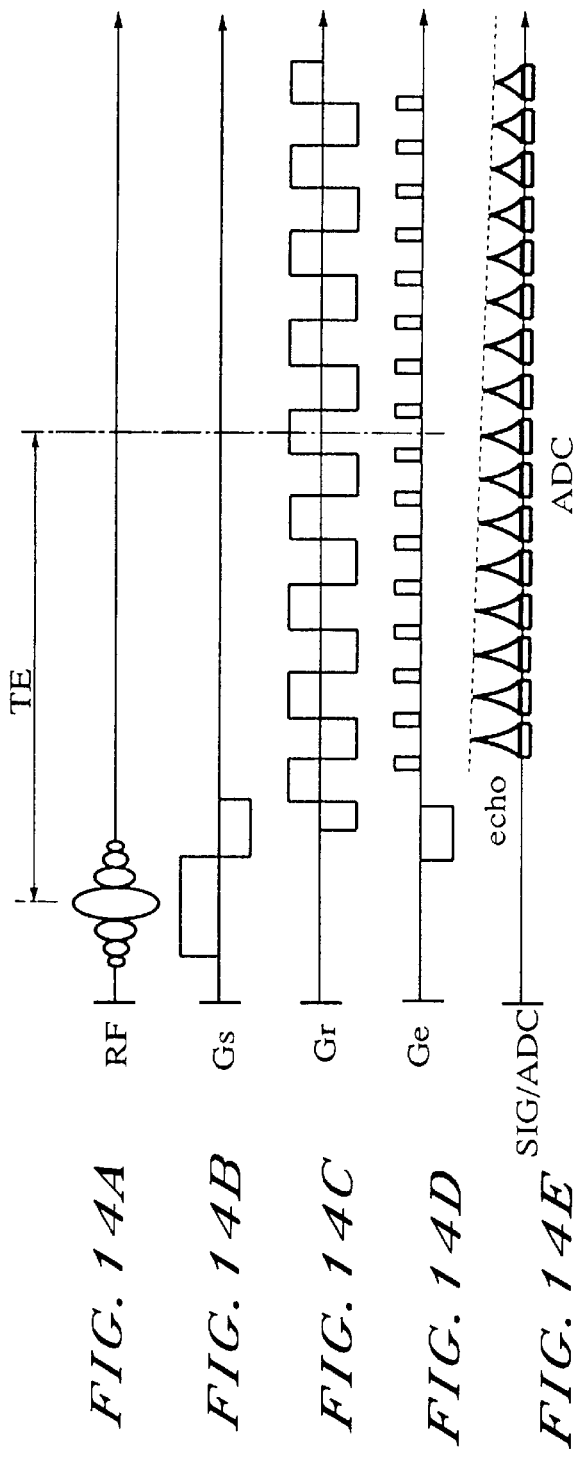
FIG. 14A
FIG. 14B
FIG. 14C
FIG. 14D
FIG. 14E
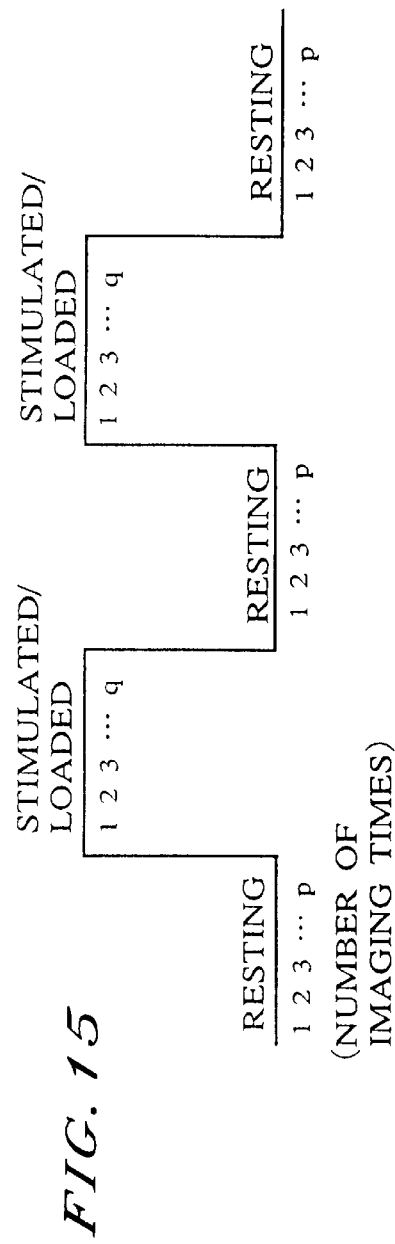
FIG. 15

METHOD AND APPARATUS FOR NUCLEAR MAGNETIC RESONANCE IMAGING OF PHYSIOLOGICAL FUNCTION INFORMATION

BACKGROUND OF THE INVENTION

1. Field of the Invention

The present invention relates to a nuclear magnetic resonance imaging, and more particularly, to a nuclear magnetic resonance imaging suitable for imaging physiological function information on an interior of a body to be examined at high speed and high precision.

2. Description of the Background Art

As well known, the nuclear magnetic resonance imaging is a method for imaging microscopic chemical and physical information of matters by utilizing the nuclear magnetic resonance phenomenon in which the energy of a radio frequency magnetic field rotating at a specific frequency can be resonantly absorbed by a group of nuclear spins having unique magnetic moments which are placed in a homogeneous static magnetic field.

In this nuclear magnetic resonance imaging, images can be obtained in various contrasts such as an image in contrast emphasizing a longitudinal relaxation time $T_1$ of nuclear spins ($T_1$ image), an image in contrast emphasizing a transverse relaxation time $T_2$ of nuclear spins ($T_2$ image), an image in contrast emphasizing a density distribution of nuclear spins (density image), and an image in contrast emphasizing a parameter $T_2^*$ ($T_2^*$ image) which reflects both the transverse relaxation time $T_2$ and a sudden phase change of nuclear spins due to a microscopic magnetic field inhomogeneity within a voxel.

On the other hand, as described in S. Ogawa et al.: "Oxygenation-Sensitive Contrast in Magnetic Resonance Image of Rodent Brain at High Magnetic Fields", Magnetic Resonance in Medicine 14, pp. 68–78, 1990, it is known that, among the hemoglobin contained in blood of a living body, the oxyhemoglobin contained in abundance in the arterial blood is diamagnetic, while the deoxyhemoglobin mainly contained in the venous blood is paramagnetic. Then, as described in R. M. Weisskoff et al.: "MRI Susceptometry: Image-Based Measurement of Absolute Susceptibility of MR contrast Agents and Human Blood", Magnetic Resonance in Medicine 24, pp. 375–383, 1992, it is also known that the diamagnetic oxyhemoglobin does not disturb a local magnetic field very much (magnetic susceptibility difference of 0.02 ppm with respect to living body tissues), but the paramagnetic deoxyhemoglobin has sufficiently large magnetic susceptibility difference with respect to surrounding tissues (magnetic susceptibility difference of 0.15 ppm with respect to living body tissues) to disturb the magnetic field so that the parameter $T_2^*$ is going to be shortened.

Also, as described in J. A. Detre, et al.: "Perfusion Imaging", Magnetic Resonance in Medicine 23, pp. 37–45, 1992, in some imaging schemes of the nuclear magnetic resonance imaging, when an amount or a speed of a local blood flow within living body tissues changes, the relaxation time (such as $T_1$) of a living body seemingly appears to have changed, and an image contrast can be changed.

By utilizing the above noted properties, it is possible to image a change of blood flow or a change of oxygen density in blood due to a physiological function such as a cell activity within living body tissues including an activation of a visual area in a brain cortex caused by a light stimulation, as described for example in K. K. Kwong et al.: "Dynamic magnetic resonance imaging of human brain activity during primary sensory stimulation", Proc. Natl. Acad. Sci. USA, Vol. 89. pp. 5675–5679, June 1992. Conventionally, an imaging scheme used in this type of imaging has been the echo planar scheme or the gradient echo scheme.

However, in these imaging schemes, a signal change (image contrast change) caused by a physiological function within a living body is quite minute. For this reason, conventionally, this minute signal change has been detected by calculating a difference of images before and after an occurrence of a physiological function phenomenon, or by applying a statistical processing. An example of a statistical data processing scheme to be used for this purpose is a scheme using the paired t-test as described in R. T. Constable, et al.: "Functional Brain Imagings at 1.5 T using Conventional Gradient Echo MR Imaging Techniques", Magnetic Resonance Imaging, Vol. 11, pp. 451–459, 1993. In the former case of using a difference, there is a need to obtain an image with high S/N ratio, while in the latter case of using a statistical processing, there is a need to obtain a plurality of images, so that the imaging time tends to be longer and it becomes easier for the images to be affected by a motion of the living body.

Moreover, it is also well known that the image distortion can be caused in nuclear magnetic resonance imaging when the static magnetic field distribution is inhomogeneous, and this image distortion becomes particularly noticeable in the imaging scheme for the $T_2^*$ image which is used in detecting a physiological function phenomenon such as a cell activity in a living body. In this regard, a method for correcting this image distortion by using processing such as the affine transformation is described in Japanese Patent Application No. 5-22759 (1993).

Thus, a detection of a minute signal change (image contrast change) caused by a physiological function within a living body requires a high S/N ratio image or a number of images, but for this reason the imaging time becomes long, and it becomes easier to receive an influence of a motion of a living body, such that it has been difficult to detect a minute signal change (image contrast change) caused by a physiological function within a living body. In fact, it is well known that a position and a size of a brain can change in synchronization with the heart beat, as described in B. P. Poncelet, et al.: "Brain Parenchyma Motion: Measurement with Cine Echo-Planar MR imaging", Radiology, Vol. 185, pp. 645–651, December 1992.

Thus, because of an influence of a body movement due to breathing or heart beat, it has conventionally been impossible to accurately detect a signal change (image contrast change) caused by a physiological function such as a cell activity in a living body.

On the other hand, it has been discovered that, when a brain is imaged by the nuclear magnetic resonance imaging while giving a stimulation such as a visual stimulation, an image contrast changed portion due to presence/absence of the stimulation coincides with a physiologically known portion which reacts to the stimulation, that is, it is possible to image an active portion of a brain by the nuclear magnetic resonance imaging. The reason why it is possible to detect an active portion of a brain is considered as that the active portion requires more energy so that an amount of blood flowing into a region of the active portion and an amount of the deoxyhemoglobin in a vicinity of this region at a level of capillary vessels which play a role in an energy exchange are increasing. These changes in a state of the blood is called the BOLD (Blood Oxygen Level Dependent) effect, and it can be detected by the $T_2^*$ emphasizing pulse sequence which is sensitive to a change of the magnetic susceptibility, such as the EPI (Echo Planar Imaging), and the FE (Field Echo) with a long TE time.

A brain function image is an image of a brain in which an amount of change in the image contrast due to presence/absence of a stimulation is extracted as an active portion by means of a subtraction processing or a statistical processing on images taken with/without the stimulation by the nuclear magnetic resonance imaging. Thus, by using nuclear magnetic resonance imaging, it becomes possible to image an active portion of a brain at very high spatial resolution compared with other available means such as a SQUID used for a magnetoencephalography, and it provides a new scheme for detecting an active state of a brain. This brain function imaging scheme is attracting much attention because it is low invasive due to its use of bloods as a natural contrast medium, and it is readily realizable by using a widely spread nuclear magnetic resonance imaging apparatus.

Unlike the electro-physiological measurement scheme such as magnetoencephalography using a SQUID which has a good time resolution, this brain function imaging scheme is not suitable for the measurement of a latency with respect to a stimulation because of a presence of a delay time on an order of seconds for the activation after the stimulation as the active portion in the brain function image depends on a change in a state of blood flow. Also, although dependent on an amount of stimulation, an amount of change in the image contrast is about 0.5 to 5% of the image contrast which is rather small. Consequently, the active portion is detected in this brain function imaging scheme as a difference image between an image with a stimulation and an image without a stimulation. Here, in order to prevent a slight displacement between the images due to an influence of motion such as pulsation and to improve the S/N ratio, many images are taken under repeated presence/absence of a time series type stimulation, and the active portion is extracted by an averaging processing or a statistical processing.

Thus, the brain function imaging scheme is capable of imaging an active portion related to an activity in a brain rather than a physical shape information on a brain. However, in order to obtain a brain function image, it is necessary to image a brain repeatedly with and without a stimulation to a brain, so that the imaging time becomes long.

In addition, in order to be able to utilize a brain function image clinically, it is necessary to obtain a physical shape image and a blood vessel image strongly related to a brain function image at the same time and check a correlation relationship among these three images, but these three images are taken independently one by one, so that the entire imaging time becomes long, and the processing among the images becomes difficult because of a position displacement among the images which are taken independently.

SUMMARY OF THE INVENTION

It is therefore an object of the present invention to provide a method and an apparatus for nuclear magnetic resonance imaging, capable of obtaining a brain function image, a blood vessel image, and a physical shape image at high speed, in a short time.

It is another object of the present invention to provide a method and an apparatus for nuclear magnetic resonance imaging, capable of imaging a blood flow change and an oxygen density in blood related to a physiological function change in a living body at high precision.

According to one aspect of the present invention there is provided a method of nuclear magnetic resonance imaging, comprising the steps of: imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images; and controlling the pulse sequence to realize a first imaging scheme for acquiring first image data emphasizing the nuclear magnetic resonance signals from blood flow portions in a desired region of the body to be examined, and a second imaging scheme for acquiring second image data emphasizing a change of a magnetic field inhomogeneity due to a change of an amount of blood flow in the desired region of the body to be examined, by a single execution of the pulse sequence at the imaging step.

According to another aspect of the present invention there is provided an apparatus for nuclear magnetic resonance imaging, comprising: imaging means for imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images; and control means for controlling the pulse sequence to realize a first imaging scheme for acquiring first image data emphasizing the nuclear magnetic resonance signals from blood flow portions in a desired region of the body to be examined, and a second imaging scheme for acquiring second image data emphasizing a change of a magnetic field inhomogeneity due to a change of an amount of blood flow in the desired region of the body to be examined, by a single execution of the pulse sequence at the imaging means.

According to another aspect of the present invention there is provided a method of nuclear magnetic resonance imaging, comprising the steps of: imaging a desired region of a body to be examined placed in a homogeneous static magnetic field by applying radio frequency magnetic field and gradient magnetic fields according to a pulse sequence realizing an imaging scheme for obtaining image data reflecting a physiological function information on the desired region of the body to be examined, and acquiring the image data by detecting nuclear magnetic resonance signals emitted from the body to be examined in response to the radio frequency magnetic field and the gradient magnetic fields, under a first condition in which a physiological function at the desired region of the body to be examined is inactive and under a second condition in which a physiological function at the desired region of the body to be examined is active; selecting valid data from the image data acquired at the imaging step, for each of the first and second conditions; determining active portions which have changed between the image data acquired under the first condition and the image data acquired under the second condition, by using the valid data selected at the selecting step; and displaying the active portions determined at the determining step.

According to another aspect of the present invention there is provided an apparatus for nuclear magnetic resonance imaging, comprising: means for imaging a desired region of a body to be examined placed in a homogeneous static magnetic field by applying radio frequency magnetic field and gradient magnetic fields according to a pulse sequence realizing an imaging scheme for obtaining image data reflecting a physiological function information on the desired region of the body to be examined, and acquiring the image data by detecting nuclear magnetic resonance signals emitted from the body to be examined in response to the radio frequency magnetic field and the gradient magnetic fields, under a first condition in which a physiological function at the desired region of the body to be examined is inactive and under a second condition in which a physiological function at the desired region of the body to be examined is active; means for selecting valid data from the image data acquired by the imaging means, for each of the first and second conditions; means for determining active portions which have changed between the image data acquired under the first condition and the image data acquired under the second condition, by using the valid data selected by the selecting means; and means for displaying the active portions determined by the determining means.

Other features and advantages of the present invention will become apparent from the following description taken in conjunction with the accompanying drawings.

BRIEF DESCRIPTION OF THE DRAWINGS

FIG. 2 is a pulse sequence diagram showing one exemplary pulse sequence according to the first embodiment of a nuclear magnetic resonance imaging scheme according to the present invention.

FIG. 3 is a pulse sequence diagram showing another exemplary pulse sequence according to the first embodiment of a nuclear magnetic resonance imaging scheme according to the present invention.

FIG. 4 is a pulse sequence diagram showing another exemplary pulse sequence according to the first embodiment of a nuclear magnetic resonance imaging scheme according to the present invention.

FIG. 5 is a diagram showing an offset frequency control used in conjunction with the pulse sequence of FIG. 4.

FIG. 6 is a pulse sequence diagram showing a modification of the pulse sequence of FIG. 2.

FIG. 7 is a pulse sequence diagram showing a modification of the pulse sequence of FIG. 3.

FIG. 8 is a pulse sequence diagram showing a modification of the pulse sequence of FIG. 4.

FIG. 9 is a table summarizing an exemplary setting of various imaging conditions to be used in conjunction with the pulse sequences of FIGS. 2, 3, and 4.

FIG. 10 is a timing chart showing an exemplary image acquisition procedure suitable for the first embodiment of a nuclear magnetic resonance imaging scheme according to the present invention.

FIG. 13 is a pulse sequence diagram showing one exemplary pulse sequence suitable for the second embodiment of a nuclear magnetic resonance imaging scheme according to the present invention.

FIG. 14 is a pulse sequence diagram showing another exemplary pulse sequence suitable for the second embodiment of a nuclear magnetic resonance imaging scheme according to the present invention.

FIG. 15 is a chart showing an exemplary image acquisition procedure suitable for the second embodiment of a nuclear magnetic resonance imaging scheme according to the present invention.

DETAILED DESCRIPTION OF THE PREFERRED EMBODIMENTS

Referring now to FIG. 1 to FIG. 11, the first embodiment of a nuclear magnetic resonance imaging (MRI) scheme according to the present invention will be described in detail.

This first embodiment concerns improvements on the pulse sequence and the image calculation processing for the brain function image which makes the imaging time shorter and the identification of an active portion easier, so as to effectively improve a usefulness of the brain function image.

Figure 1:
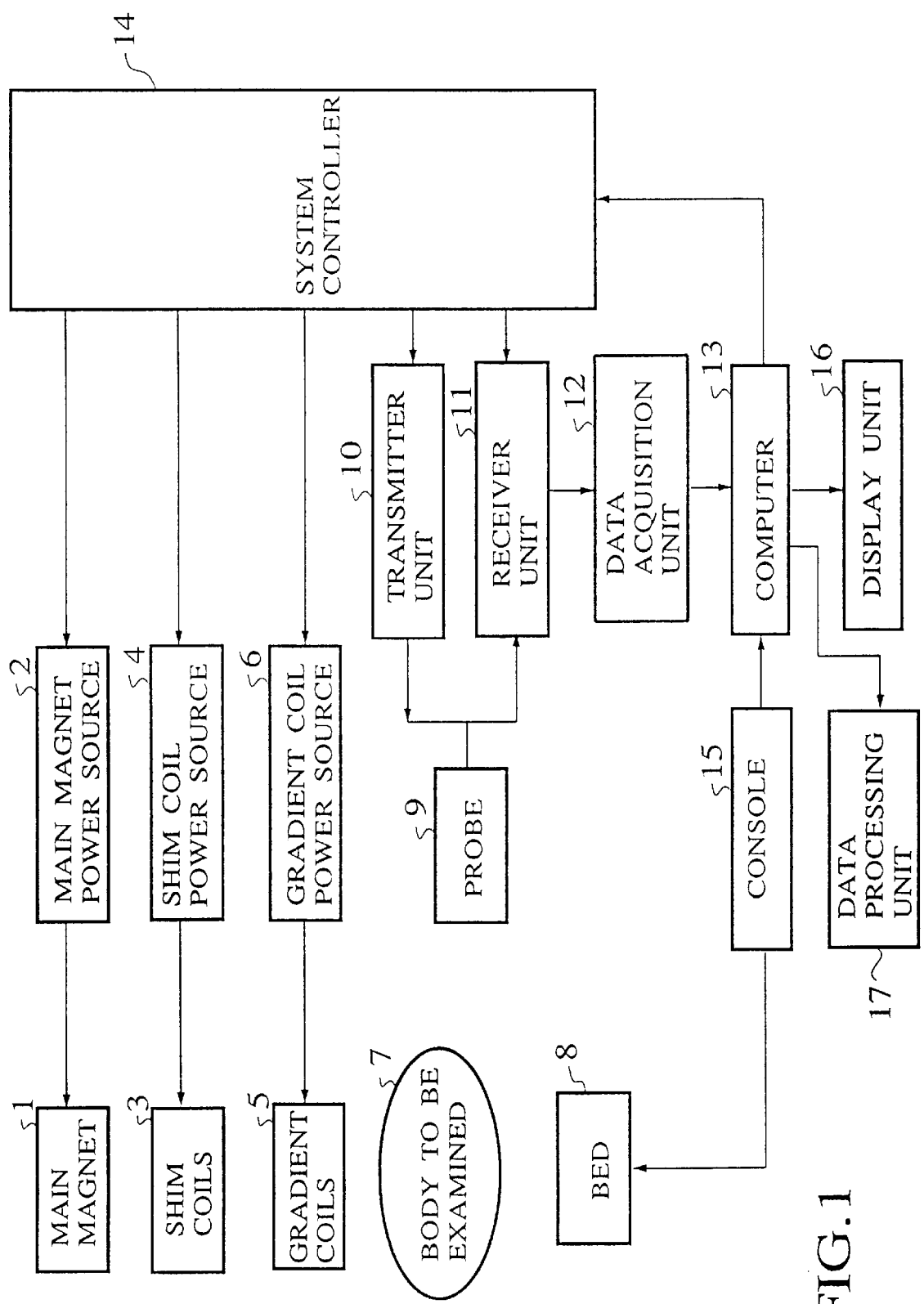
FIG. 1 is a block diagram of a nuclear magnetic resonance imaging apparatus suitable for the first embodiment of a nuclear magnetic resonance imaging scheme according to the present invention.

In this first embodiment, the MRI apparatus has an overall configuration as shown in FIG. 1, which includes a main magnet 1 for generating a static magnetic field, shim coils 3 for adjusting a homogeneity of the static magnetic field, and gradient coils 5 for generating gradient magnetic fields, which are driven by a main magnet power source 2, a shim coil power source 4, and a gradient coil power source 6, respectively, such that the homogeneous static magnetic field and the gradient magnetic fields having linear gradient field distribution in three orthogonal directions can be applied onto a body to be examined 7. Here, the gradient magnetic fields include a slicing gradient field Gs to be applied in a direction perpendicular to a desired slice plane, a reading gradient field Gr to be applied in a direction perpendicular to the slicing gradient field Gs, and an encoding gradient field Ge to be applied in a direction perpendicular to both the slicing gradient field Gs and the reading gradient field Gr.

In addition, there is provided a probe 9 to which radio frequency signals are transmitted from a transmitter unit 10 such that radio frequency magnetic fields (RF pulses) can be applied from this probe 9 to the body to be examined 7. This probe 9 is also used for receiving the nuclear magnetic resonance signals emitted from the body to be examined 7 in response to the application of these magnetic fields, a separate transmission coil and reception coil may be provided instead of this probe 9 if desired.

The nuclear magnetic resonance signals (echo signals) received by the probe 9 are detected and amplified at a receiver unit 11, then acquired and A/D converted at a data acquisition unit 12, and then supplied to a data processing unit 17 through a computer 13.

Here, the operations of the main magnet power source 2, the shim coil power source 4, the gradient coil power source 6, the transmitter unit 10, the receiver unit 11, and the data acquisition unit 12 are controlled by a system controller 14, which in turn is controlled from a console 15 through the computer 13.

At the data processing unit 17, under the control of the computer 13, the image reconstruction processing is carried out according to the echo signals supplied from the data acquisition unit 12 by using the Fourier transform, so as to obtain the image data.

The obtained images are then displayed on a display unit 16. This display unit 16 as well as the computer 13 and a bed 8 for mounting the body to be examined 7 thereon are controlled from the console 15. Here the display unit 16 has a plurality of image memories for enabling an independent display of a plurality of original images as well as a display of these images in superposition.

Next, the imaging scheme of this first embodiment for obtaining a brain function image, a blood vessel image, and a physical shape image at high speed, by using this MRI apparatus of FIG. 1 will be described.

Here, in general, there are two known schemes for obtaining a blood vessel image, including the TOF (Time Of Flight) scheme in which blood flow component signals are contrasted against brain parenchyma portion signals lowered by means of the T1 saturation effect caused by the shortening the sequence repetition time TR, and a phase shift scheme in which a difference in phases of images obtained by pulse sequences with and without a flow encoding pulse is utilized for imaging the flow component mapped in an amount of phase shift.

In the phase shift scheme, a flow encoding pulse is to be applied according to a direction of flow, so that at the brain parenchyma portion which has three dimensionally crossing directions of flows, altogether six pulse sequences for a flow re-phase and a flow de-phase in each of three axial directions are necessary, and consequently the imaging time increases and the pulse sequences are complicated. On the other hand, this phase shift scheme has an advantage that a large amount of signals taken from the brain parenchyma portion can be cancelled out as a portion with no phase shift, so that by setting the second and subsequent echo signals large, it is possible to obtain a physical shape image or an image emphasizing a change of a magnetic field inhomogeneity (a field inhornogeneity image) at high SNR (Signal to Noise Ratio).

Now, FIG. 2 shows an exemplary pulse sequence for realizing the imaging scheme of this first embodiment for obtaining a brain function image, a blood vessel image, and a physical shape image altogether.

In this pulse sequence of FIG. 2, the RF pulse 21 and the slicing gradient field 22 are applied first, to selectively excite the body to be examined in a slicing direction. Then, a correction reading gradient field 31 is applied in order to suppress the motion artifact, while the phase encoding gradient field 26 is applied. Then, by means of the sequentially switching reading gradient field 23, 24, and 25, the field echoes 28, 29, and 30 are generated sequentially.

For the blood vessel image, the TOF scheme or the phase shift scheme is applied to the first echo 28 on which the influence of the flow artifact is small. On the other hand, the field inhomogeneity image is obtained from the third echo 30 which has a sufficiently long transverse relaxation time to obtain the $T_2^*$ contrast. Then, the physical shape image is obtained from the second echo 29 by utilizing a period between the first echo 28 and the third echo 30. Here, the image data can be separately acquired from the field echoes 28, 29, and 30 by means of the application of the phase encoding gradient field 26.

In addition, the strength of the reading gradient field Gr is varied for each of these field echoes 28, 29, and 30 in order to obtain appropriate imaging bandwidths for the respective field echoes. Namely, for the first echo 28, in order to prevent a dispersion of the blood flow signals excited by the RF pulse 21 due to the flow, the echo time TE is set to be short. Consequently, the strength of the reading gradient field 23 for the first echo 28 is large, and the corresponding data acquisition time is short, so that the SNR becomes low. On the other hand, for the third echo 30, a long data acquisition time is set up in order to obtain the $T_2^*$ relaxation effect even during the application of the reading gradient field 25, such that the signals can be acquired at high SNR. By means of this, the lowering of the signals due to the extension of the echo time TE can be compensated. For the second echo 29, the intermediate setting between those for the first and third echoes is used. For this second echo 29, by making the data acquisition time as long as possible within a range for which the third echo 30 can be optimized, it becomes possible to acquire the signals at higher SNR than the first echo 28.

Next, FIG. 3 shows another exemplary pulse sequence for realizing the imaging scheme of this first embodiment for obtaining a brain function image, a blood vessel image, and a physical shape image together, which incorporates an additional feature for enabling the selection of the resolution for each echo.

First, the resolution within a plane can be changed as follows. Namely, as the resolution in the reading direction is determined by the gradient field strength and a manner of sampling, by fixing the manner of sampling, the resolution can be changed by varying the gradient field strength applied for each echo. For example, by making a strength of the reading gradient field 38 twice as strong, it is possible to double the resolution for the physical shape information. Here, if the matrix size is the same, the imaging region is reduced to ½. By this control of the resolution, the optimization of the SNR can be made.

Next, in addition to the optimization of the SNR by controlling the resolution in the phase encoding direction, the data acquisition time can be shortened by reducing a number of phase encoding steps. For example, for the same imaging region, in order to realize the imaging for the first echo at the resolution which is twice as high as that for the second echo (i.e., to set a matrix size in the encoding direction for the second echo twice as that for the first echo), it suffices to vary the phase encoding gradient field 36 similarly as the phase encoding gradient field 35 to make the total integrated amount twice as much. Also, in a case of setting the resolution for the third echo to be a half of that for the second echo while maintaining the same imaging region (i.e., to limit a number of matrices to be a half), the phase encoding gradient field 37 is set to an integrated amount of phase encoding corresponding to one half of the imaging region in a direction opposite to that of the changing step of the phase encoding gradient field 35 (i.e., toward a positive side when the phase encoding gradient field 35 is started from a negative side and changed toward a positive side). When the phase encoding gradient field 35 is exactly zero, the data acquisition for one image part is finished. In the data acquisition for the next one image part, the phase encoding gradient field 37 is set to an offset phase encoding amount in a direction opposite to that in the above described case.

Similarly, in order to change the resolution in the slicing direction, the slice encoding gradient fields 32, 33, and 34 are controlled in the similar manner as described above for the phase encoding gradient fields 35, 36, and 37, by utilizing the three dimensional Fourier scheme.

Now, the above described pulse sequence of FIG. 3 is capable of setting the optimum SNR and time resolution for each contrast by changing the resolution, but incapable of selecting the imaging region in the slicing direction. However, in a case of acquiring the signals from the head surface portion for the brain function image, it is possible to reduce a total signal acquisition time by narrowing the imaging region and improving the time resolution compared with the imaging region in the slicing direction for the physical shape image or the blood vessel image.

FIG. 4 shows another exemplary pulse sequence for realizing the imaging scheme of this first embodiment for obtaining a brain function image, a blood vessel image, and a physical shape image altogether, which incorporates an additional feature for narrowing the imaging region in the slicing direction.

In this pulse sequence of FIG. 4, the three dimensional Fourier scheme with the slice encoding is used for the first and second echoes. In this case, in addition to the excitation RF pulse 39, the refocus (180°) RF pulse 40 is also applied. At this point, the slicing gradient field 42 has a larger strength than that at a time of the application of the excitation RF pulse 39, to narrow the slice width of the refocus RF pulse 40. In addition, the slice position for refocusing can be displaced from that of the excitation RF pulse by appropriately controlling the offset frequencies $\Delta f_1$ for the RF pulse 39 and $\Delta f_2$ for the refocus RF pulse 40 as indicated in FIG. 5.

As the slice width and the slice position can be controlled freely, the imaging may be made by the three dimensional Fourier scheme while changing the slice encoding gradient field 43, or the imaging may be made by the two dimensional Fourier scheme with the increased slicing gradient field 42 and then, for the imaging region in the slicing direction, the sequential multi-slice scheme which collectively acquires the phase encoding data for one image part by changing the offset frequency control for the refocus RF pulse alone at each slice position may be applied.

In this pulse sequence of FIG. 4, the control similar to that in the pulse sequence of FIG. 3 is carried out up to the second echo, but for the third echo, in order to obtain the $T_2^*$ image, a time $\tau$ from the excitation RF pulse 39 to the refocus RF pulse 40 and a time $\tau'$ from the refocus RF pulse 40 to the echo are set up largely asymmetrically. In this case, the echo is generated asymmetrically with respect to the reading gradient field 45, so that there is a need to use a scheme such as the half Fourier scheme in a case of image reconstruction.

As for the control of the phase encoding gradient field, there is a need for a rewinding control 44 to make the integrated value in the phase encoding direction to be zero at a portion in which the refocus RF pulse 40 is applied, just as in a case of the high speed SE scheme. In a case of using the three dimensional Fourier scheme, the rewinding control 41 is carried out immediately before the application of the refocus RF pulse 40 for the slice encoding amount as well.

In the above described pulse sequences of FIGS. 2, 3, and 4, the phase encoding and the slice encoding for one line are carried per each excitation, but it is possible to modify these pulse sequences of FIGS. 2, 3, and 4 as shown in FIGS. 6, 7, and 8, respectively, such that the switching of the reading gradient field is repeated within each segment of the pulse sequence to realize the data acquisition (EPI or Interleave EPI) by acquiring many field echoes.

An exemplary setting of the various imaging conditions to be used for taking the blood vessel image, the physical shape image, and the brain function image by the pulse sequences of FIGS. 2, 3, and 4 described above are summarized in a table shown in FIG. 9.

Figure 11:
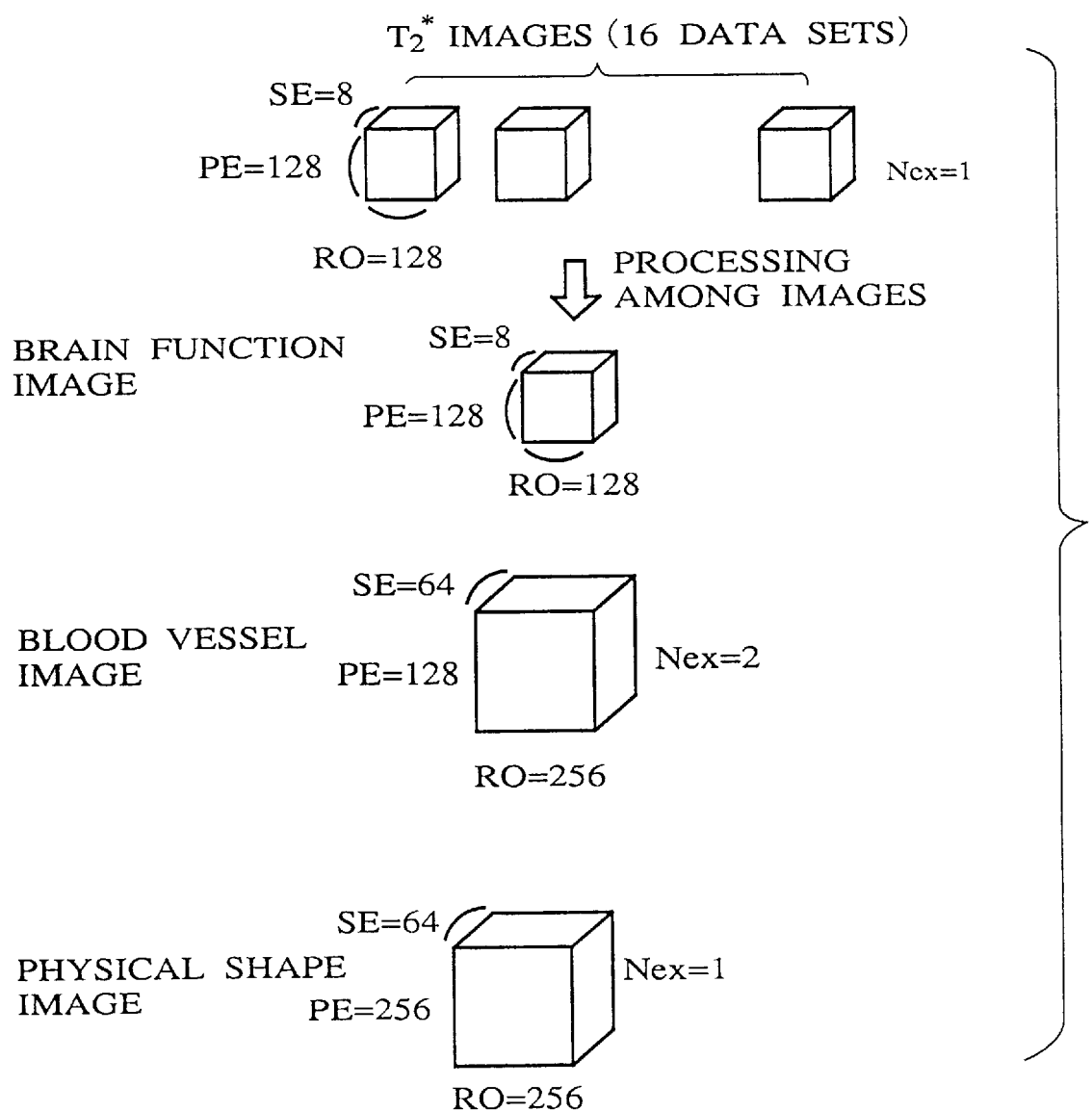
FIG. 11 is a diagram illustrating the exemplary setting of various imaging conditions shown in FIG. 9 for three types of images to be obtained by the pulse sequences of FIGS. 2, 3, and 4.

Here, by reducing a number of slice encoding steps, a number of phase encoding steps, and a number of averaging times, it is possible to improve the time resolution for the $T_2^*$ image acquisition. By utilizing this time resolution, the $T_2^*$ images are acquired consecutively in time series as indicated in FIGS. 10 and 11, where FIG. 10 shows timings for acquiring different types of images while FIG. 11 illustrates the exemplary setting summarized in a table of FIG. 9. Then the brain function active portion is extracted by the subsequent data processing. On the other hand, the blood vessel image and the physical shape image are supposed to be unaffected by the stimulation of the brain function, so that one set of data for these images are obtained in the entire acquisition time. In this first embodiment, the physical shape image is obtained by the imaging with improved spatial resolution, while the blood vessel image which tends to have a poor SNR is obtained by the imaging with improved SNR by means of the averaging processing.

It is to be noted that the imaging condition setting shown in FIG. 9 is only an exemplary one, and it is possible to change the imaging region, matrix size, etc. by optimizing the time resolution, the spatial resolution, and the SNR.

Next, a manner of image display suitable for this first embodiment will be described.

In the pulse sequences of FIGS. 2, 3, and 4 described above, the resolution is changed in order to optimize the SNR and the data acquisition time, so that the voxel sizes along the reading direction, the phase encoding direction, and the slicing direction are different among the blood vessel image, the physical shape image, and the brain function image which are to be displayed in superposition or subjected to the processing among images. Here, by setting a size of the voxel in each direction for one image to be an integer multiple of that for another image, the superposition can be made easier. For example, when the blood vessel image and the physical shape image have the same size in the reading direction, while the blood vessel image has sizes in the phase encoding direction and the slicing direction twice as large as those of the physical shape image, the display in superposition or the processing among the images can be realized for these blood vessel image and physical shape image by utilizing the copying of the image values in units of voxels for the matrix size expansion.

In the case where it is impossible to set a size of the voxel in each direction for one image to be an integer multiple of that for another image, it is still possible to utilize the Fourier interpolation by the reconstruction in which zeroes are added to the acquisition data in a direction for making the size matching before the reconstruction, such that the matrix size of the reconstructed image for one image becomes an integer multiple of that for another image.

As for a manner of producing the brain function image, besides a simple subtraction between image data with a stimulation and reference image data without a stimulation after the averaging processing, a significant signal difference can also be extracted by the t-test or the x-test between a group of images with stimulation and a group of images without stimulation, while reducing an influence due to the position displacement among the images. Also, in a case of the brain function image, the signal regions are concentrated in a brain surface, so that there is also a case in which a part of voxel after the data processing is observed as if it is projecting out of a brain surface, because of the position displacement due to the chemical shift or the difference in resolution with respect to the physical shape image. In order to correct such a portion projecting out from a brain surface, a position displacement correction technique disclosed in Japanese Patent Application No. 5-227529 (1993) can be used for a position displacement correction among the images. As for a portion that cannot be corrected by such a correction technique, it is still possible to delete it by the masking using the physical shape image, or suppress it by weighting using a small weight.

At a time of the display in superposition, the normalization can be carried out for each of the brain function image and the blood vessel image. As an algorithm for this normalization, that which obtains the pixel mean values after the extraction of the maximum value and the blood vessel portion can be used. Then, after this normalization, a difference image between these two images is generated. When the appropriate normalization parameters are selected, it is possible to extract the signals from the cortical part alone by cancelling the signals from the veins contained in the brain function image. This processing is particularly effective for an apparatus which has only a gray scale display mechanism.

In an apparatus which has a full color display mechanism, the gradation display in mutually different hues can be assigned to the physical shape image, the blood vessel image, and the brain function image, and in addition, the hues other than those assigned to these images may be assigned to the overlapping regions between two or three of these images so as to indicate a ratio of the overlapping regions appropriately. Even in this case, it is effective to carry out the normalization processing before the display, in order to secure a sufficient dynamic range at a time of the determining the gradation.

As described, according to this first embodiment, it is possible to provide a method and an apparatus for nuclear magnetic resonance imaging, capable of obtaining a brain function image, a blood vessel image, and a physical shape image at high speed, in a reduced overall imaging time. In addition, by suppressing the position displacement among the images, an appearance of a false image due to the position displacement occurring in the calculated image can be suppressed to improve a precision of the image superposed onto the physical shape image, so that the brain function portion with respect to a stimulation can be obtained at high precision.

Referring now to FIG. 12 to FIG. 16, the second embodiment of a nuclear magnetic resonance imaging (MRI) scheme according to the present invention will be described in detail.

Figure 12:
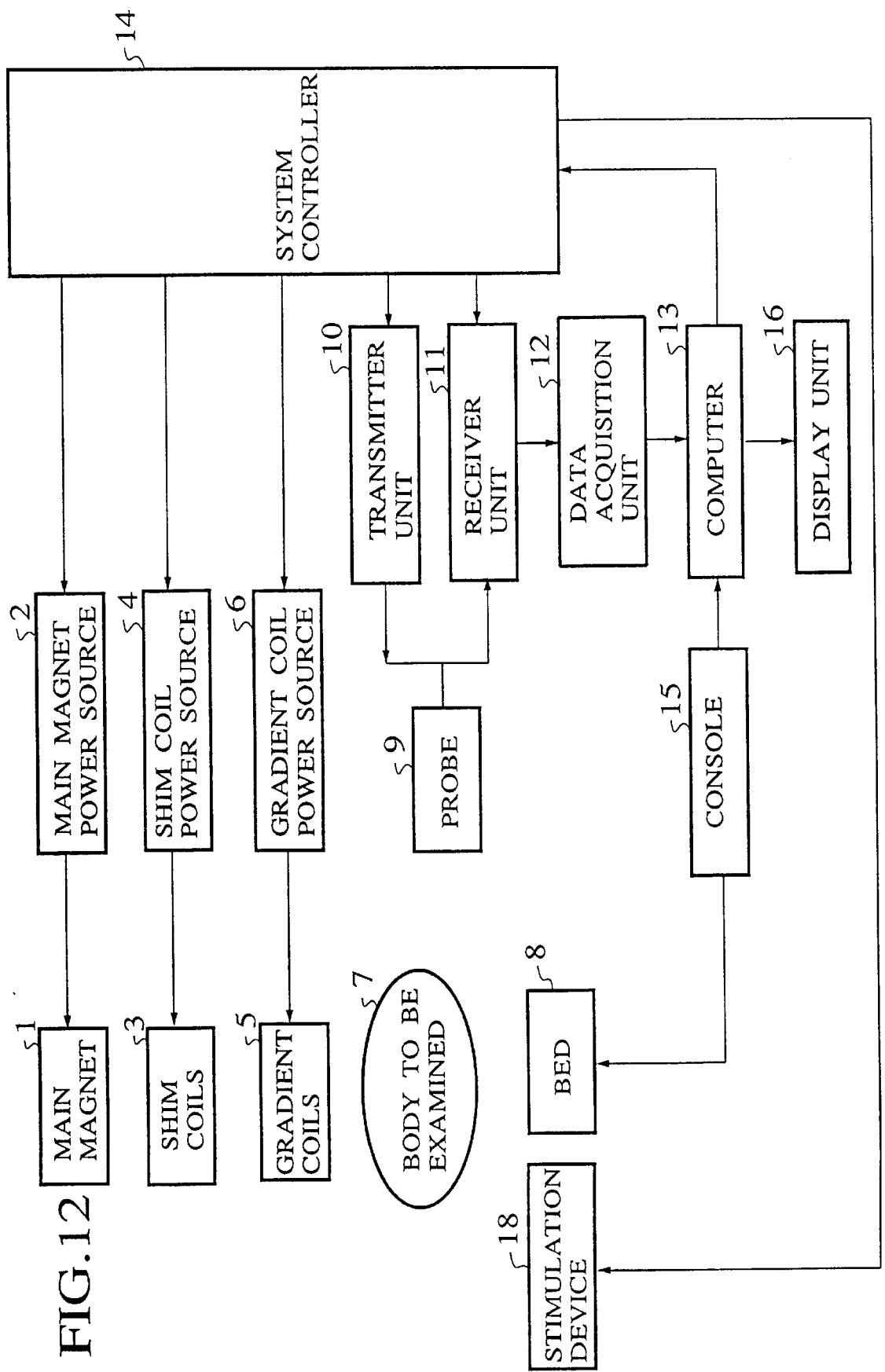
FIG. 12 is a block diagram of a nuclear magnetic resonance imaging apparatus suitable for the second embodiment of a nuclear magnetic resonance imaging scheme according to the present invention.

In this second embodiment, the MRI apparatus has an overall configuration as shown in FIG. 12, which differs from that of FIG. 1 for the first embodiment described above in that a stimulation device 18 is provided while the data processing unit 17 is omitted.

Here, the stimulation device 18 is operated under the control of the system controller 14 to give a stimulation such as light or sound to the body to be examined 7. The other elements of this MRI apparatus of FIG. 12 which are given the same reference numerals as in FIG. 1 are substantially the same as in the first embodiment described above, so that their description will not be repeated here.

Now, FIG. 13 and FIG. 14 show two exemplary pulse sequences for realizing the imaging scheme of this second embodiment for imaging physiological function information. In FIG. 13 and FIG. 14, RF denotes the RF pulse, Gs, Gr, and Ge denote the slicing, reading, and phase encoding gradient fields, respectively, and SIG/ADC denotes a timing for nuclear magnetic resonance signals and data acquisition.

In the pulse sequence of FIG. 13, the RF pulse and the slicing gradient field are applied first to excite a desired region, and the FID (Free Induction Decay) signal is generated. Then, the reading gradient field and the phase encoding gradient field are applied, and the echo signal generated in response is acquired. Then, by sequentially changing an applied amount of the phase encoding gradient field, the above sequence is repeatedly executed at a repetition time TR. here, the typical conditions for the imaging of a physiological function are that the repetition time TR is 50 to 100 ms, and the echo time TE (a time interval from a center of the RF pulse to a central data at a time data are arranged) is 30 to 70 ms. Also, the spin excitation angle due to the RF pulse is 10 to 400.

In the pulse sequence of FIG. 14, the RF pulse and the slicing gradient field are applied first to excite a desired region, and the FID (Free Induction Decay) signal is generated. Then, the reading gradient field is alternately switched between positive and negative to generate a plurality of echo signals, while the phase encoding gradient field is applied at a timing of each echo signal. Then, a plurality of generated echo signals are acquired. In this case, it is possible to obtain data for one image part by a single spin excitation. Here, the typical condition for the imaging of a physiological function is that the echo time TE (a time interval from a center of the RF pulse to an origin data at a time data are arranged two dimensionally) is 50 to 70 ms.

The data obtained by executing the pulse sequence of FIG. 13 or FIG. 14 are subjected to an appropriate preliminary processing, and then the image is reconstructed by applying the complex Fourier transform.

The image obtained in this manner is the $T_2^*$ image, which is capable of capturing a change in $T_2^*$ contrast due to a change in the magnetic susceptibility at an active portion and its vicinity caused by a change of the oxygen concentration within tissues and the local blood flow as a specific portion of the brain tissues are activated in reaction to a stimulation or load.

Now, in this second embodiment, the imaging of the physiological function information on an interior of the body to be examined is realized by executing the pulse sequence as described above to take a head portion image at a time of giving some kind of a stimulation (light or sound) or a load from the stimulation device 18 as well as at a time of resting (i.e., without a stimulation or a load).

For example, as shown in FIG. 15, the imaging at a time of resting is repeated for p times, and then the imaging at a time of giving a stimulation/load is repeated for q times. Then, this pattern of imaging is further repeated to obtain P pieces of the images at a time of resting and Q pieces of the images at a time of giving a stimulation/load.

Figure 16:
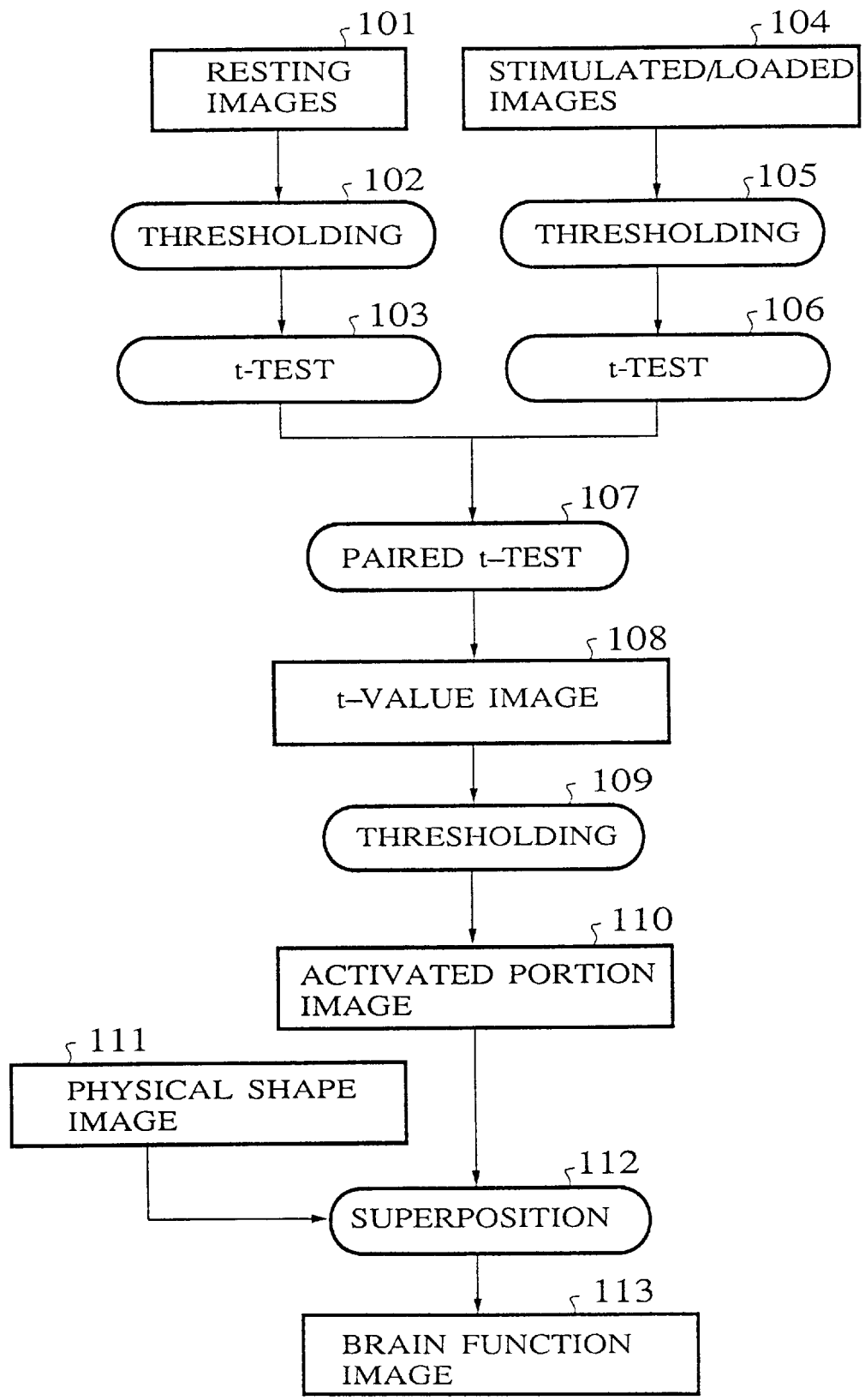
FIG. 16 is a flow chart showing a data processing procedure according to the second embodiment of a nuclear magnetic resonance imaging scheme according to the present invention.

Then, in order to detect the active portion with respect to the stimulation/load, the following data processing is carried out according to a procedure indicated in FIG. 16. In the following explanation, the standard notataions for the t-test and the paired t-test will be used, and their detailed explanations will be omitted here as they are well known.

First, for all the images at a time of resting 101 and all the images at a time of giving a stimulation/load 104, the thresholding processing for distinguishing regions containing the living body signals and region containing noises alone is carried out (steps 102 and 105). The subsequent processing is applied only to data (valid pixels) in the regions containing the living body signals. By means of this, the data processing time can be shortened, and in addition, an erroneous detection of an unnecessary signal change can be reduced.

Next, for the valid pixels in P pieces of the images at a time of resting and the valid pixels in Q pieces of the images at a time of giving a stimulation/load, the t-test is carried out to select the valid data (steps 103 and 106). In general, the t-distribution with n degrees of freedom is defined by the following equation (1).

$$f(x) = \frac{\Gamma\left(\frac{n+1}{2}\right)}{\sqrt{n\pi}\,\Gamma\left(\frac{n}{2}\right)\left(1+\frac{x^2}{n}\right)^{(n+1)/2}}, \quad (-\infty < x < \infty) \qquad (1)$$

In the t-test processing of this second embodiment, according to the t-distribution defined by the equation (1), numbers of data P' and Q' (degrees of freedom) and t-values $t_{P'}(\alpha)$ and $t_{Q'}(\alpha)$ at a level of significance $\alpha$ are calculated. Here, P' and Q' represent numbers of valid data after the thresholding processing on the image data. Also, the level of significance a typically takes a value of 0.001 to 0.005.

Next, for the valid data at each valid pixel of each mother set (a set of images at a time of resting or a set of images at a time of giving a stimulation/load), a t-value $T(\bar{x}, S^2)$ defined by the following equations (2) to (4) is calculated.

$$T(\bar{x}, S^2) = \frac{\bar{x} - x_i}{S/\sqrt{N}} \qquad (2)$$

$$\bar{x} = \frac{1}{N} \sum_{i=1}^{N} x_i \qquad (3)$$

$$S^2 = \frac{1}{N-1} \sum_{i=1}^{N} (\bar{x} - x_i)^2 \qquad (4)$$

where $x_i$ is a valid data value at each pixel, and N is a number of valid data at each valid pixel.

Then, according to the calculated t-values, data for which the following inequalities (5) and (6) are satisfied are selected out and set as new valid data.

$$|T(\bar{x}, S^2)| < t_{p'}(\alpha) \qquad (5)$$

$$|T(\bar{x}, S^2)| < t_{q'}(\alpha) \qquad (6)$$

By means of this t-test processing, it is possible to remove those image data for which good results were not obtained due to an influence of a body movement or other cause at a time of acquiring the image data. Here, numbers of newly selected valid data are denoted by P" and Q".

Next, with respect to the newly selected valid data at a time of resting and at a time of giving a stimulation/load, the paired t-test is carried out (step 107).

Here, according to the t-distribution defined by the equation (1), a t-value $t''(\alpha)$ at the level of significance $\alpha$ with respect to the smaller one of numbers of data P" and Q" is calculated first, for each valid pixel.

Then, for each valid pixel, a t-value $T(\bar{x}_1, \bar{x}_2, S^2)$ defined by the following set of equations (7) is calculated for data of the smaller one of numbers of data P" and Q", to obtain the t-value image 108.

$$Cov(\bar{x}_1, \bar{x}_2) = \frac{1}{N-1} \sum_{i=1}^{N} (x_{1i} - \bar{x}_1)(x_{2i} - \bar{x}_2) \qquad (7)$$

$$S_1^2 = \frac{1}{N-1} \sum_{i=1}^{N} (x_{1i} - \bar{x}_1)^2$$

-continued $$S_2^2 = \frac{1}{N-1} \sum_{i=1}^{N} (x_{2i} - \bar{x}_2)^2$$

$$S^2 = \frac{S_1^2 + S_2^2 - 2Cov(\bar{x}_1, \bar{x}_2)}{N}$$

$$T(\bar{x}_1, \bar{x}_2, S^2) = \frac{\bar{x}_1 - \bar{x}_2}{\sqrt{S^2}}$$

Here, a manner of selecting data to be paired in this calculation can be that for pairing those image data which have closest imaged times for example, or any other manner suitable according to circumstances.

Then, according to the calculated t-values, the pixels for which the following inequality (8) is satisfied are selected out (step 109) and set as an active portion.

$$T(\bar{x}_1, \bar{x}_2, S^2) > t''(\alpha) \qquad (8)$$

The active portion 110 obtained in this manner is then superposed with a physical shape image 111 or a blood vessel image taken from the same physical region (step 112) to obtain a brain function image 113 and displayed.

At this point, the information can be displayed in an easily comprehensible manner by displaying different images in different colors, such as the physical shape image in black and white gradation, the blood vessel image in red, and the active portion in yellow or blue gradation for example.

Also at this point, the contrast information for the active portion can be subjected to an appropriate processing such as a normalization of the changed amount with respect to the calculated t-values, or the averaged values of the valid data, or the signal values for example, according to circumstances.

It is to be noted that the data processing procedure in this second embodiment described above may be modified in various manners as follows.

First, the value $|T(\bar{x}, S^2)|$ used in the inequalities (5) and (6) may be replaced by $T(\bar{x}, S^2)$ or $-T(\bar{x}, S^2)$ depending on circumstances.

Similarly, the value $T(\bar{x}_1, \bar{x}_2, S^2)$ used in the inequality (8) may be replaced by $|T(\bar{x}_1, \bar{x}_2, S^2)|$ or $-T(\bar{x}_1, \bar{x}_2, S^2)$ depending on circumstances.

Also, the set of equations (7) used in the above procedure may be replaced by the following set of equations (9)

$$S_1^2 = \frac{1}{N_1 - 1} \sum_{i=1}^{N2} (x_{1i} - \bar{x}_1)^2 \qquad (9)$$

$$S_2^2 = \frac{1}{N_2 - 1} \sum_{i=1}^{N1} (x_{2i} - \bar{x}_2)^2$$

$$S^2 = \frac{(N_1 - 1)S_1^2 + (N_2 - 1)S_2^2}{N_1 + N_2 - 2}$$

$$T(\bar{x}_1, \bar{x}_2, S^2) = \frac{\bar{x}_1 - \bar{x}_2}{\sqrt{(1/N_1 + 1/N_2)S^2}}$$

In addition, it is also possible to execute only a part of the above described data processing procedure according to this second embodiment, if desired, even though the above described data processing procedure of this second embodiment is primarily intended as a series of processing to be executed completely.

It is also to be noted that this second embodiment is applicable not just to a region in the head portion such as a brain as described above, but similarly also to a region in the abdomen portion such as a liver for example.

As described, according to this second embodiment, it is possible to realize the imaging of a physiological function information on an interior of a body to be examined at high precision, without receiving an influence of a body movement of a body to be examined, etc., so that an information useful in diagnosing diseases or investigating living body functions can be obtained non-invasively.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method for nuclear magnetic resonance imaging, comprising the steps of:

imaging a body to be examined placed in a homogeneous static magnetic field by applying radio frequency magnetic field and gradient fields having a slicing gradient field, a reading gradient field and a phase encoding gradient field, according to a pulse sequence in which a pulse of said radio frequency magnetic field and a pulse of said slicing gradient field are applied for selectively exciting the body to be examined in one slicing direction, a pulse of said reading gradient field for suppressing a motion artifact is applied during an application of a pulse of said phase encoding gradient field, and field echoes are sequentially generated by sequentially switching said reading gradient field, detecting nuclear magnetic resonance signals emitted from the body to be examined in response to the radio frequency magnetic field and the gradient magnetic fields, and processing the nuclear magnetic resonance signals to construct nuclear magnetic resonance images; and controlling the pulse sequence by varying periods for switching said reading gradient field so as to realize a first imaging scheme for acquiring first image date emphasizing the nuclear magnetic resonance signals from blood flow portions in a desired region of the body to be examined, and a second imaging scheme for acquiring second image data emphasizing a change of a magnetic field inhomogeneity due to a change of an amount of blood flow in the desired region of the body to be examined, by a single execution of the pulse sequence at the imaging step.

2. The method of claim 1, wherein the controlling step controls the pulse sequence to execute the first imaging scheme before the second imaging scheme.

3. The method of claim 1, wherein the controlling step controls the pulse sequence such that the first image data are acquired at a high spatial resolution, while the second image data are acquired at a high time resolution.

4. The method of claim 1, wherein the controlling step also controls the pulse sequence such that at least one of a number of phase encoding steps, a number of slice encoding steps, and a number of slices is set up independently for the first and second imaging schemes.

5. The method of claim 1, wherein the controlling step also controls the pulse sequence such that an imaging region is set up independently for the first and second imaging schemes.

6. The method of claim 1, wherein the controlling step also controls the pulse sequence to realize a third imaging scheme for acquiring third image data indicating a physical shape information on the desired region of the body to be examined.

7. The method of claim 6, wherein the controlling step controls the pulse sequence to execute the third imaging scheme between the first imaging scheme and the second imaging scheme.

8. The method of claim 6, wherein the controlling step also controls the pulse sequence such that at least one of a number of phase encoding steps, a number of slice encoding steps, and a number of slices is set up independently for the first, second, and third imaging schemes.

9. The method of claim 6, wherein the controlling step also controls the pulse sequence such that an imaging region is set up independently for the first, second, and third imaging schemes.

10. The method of claim 6, further comprising the steps of:

repeating the imaging step and the controlling step under a first condition in which a physiological function at the desired region of the body to be examined is inactive and under a second condition in which a physiological function at the desired region of the body to be examined is active;

obtaining a physiological function image by applying subtraction/statistical processing on the second image data acquired by the second imaging scheme under the first and second conditions, while obtaining a blood vessel image from the first image data acquired by the first imaging scheme and a physical shape image from the third image data acquired by the third imaging scheme;

matching voxel sizes along reading, phase encoding, and slicing directions in the physiological function image, the blood vessel image, and the physical shape image obtained at the obtaining step; and displaying at least two of the physiological function image, the blood vessel image, and the physical shape image in superposition, by using the voxel sizes matched at the matching step.

11. An apparatus for nuclear magnetic resonance imaging, comprising:

imaging means for imaging a body to be examined placed in a homogeneous static magnetic field by applying radio frequency magnetic field and gradient magnetic fields having a slicing gradient field, a reading gradient field and a phase encoding gradient field, according to a pulse sequence in which a pulse of said radio frequency magnetic field and a pulse of said slicing gradient field are applied for selectively exciting the body to be examined in one slicing direction, a pulse of said reading gradient field for suppressing a motion artifact is applied during an application of a pulse of said phase encoding gradient field, and field echoes are sequentially generated by sequentially switching said reading gradient field, detecting nuclear magnetic resonance signals emitted from the body to be examined in response to the radio frequency magnetic field and the gradient magnetic fields, and processing the nuclear magnetic resonance signals to construct nuclear magnetic resonance images; and control means for controlling the pulse sequence by varying periods for switching said reading gradient field so as to realize a first imaging scheme for acquiring first image data emphasizing the nuclear magnetic resonance signals from blood flow portions in a desired region of the body to be examined, and a second imaging scheme for acquiring second image data emphasizing a change of a magnetic field inhomogeneity due to a change of an amount of blood flow in the desired region of the body to be examined, by a single execution of the pulse sequence at the imaging means.

12. The apparatus of claim 11, wherein the control means controls the pulse sequence to execute the first imaging scheme before the second imaging scheme.

13. The apparatus of claim 11, wherein the control means controls the pulse sequence such that the first image data are acquired at a high spatial resolution, while the second image data are acquired at a high time resolution.

14. The apparatus of claim 11, wherein the control means also controls the pulse sequence such that at least one of a number of phase encoding steps, a number of slice encoding steps, and a number of slices is set up independently for the first and second imaging schemes.

15. The apparatus of claim 11, wherein the control means also controls the pulse sequence such that an imaging region is set up independently for the first and second imaging schemes.

16. The apparatus of claim 11, wherein the control means also controls the pulse sequence to realize a third imaging scheme for acquiring third image data indicating a physical shape information on the desired region of the body to be examined.

17. The apparatus of claim 16, wherein the control means controls the pulse sequence to execute the third imaging scheme between the first imaging scheme and the second imaging scheme.

18. The apparatus of claim 16, wherein the control means also controls the pulse sequence such that at least one of a number of phase encoding steps, a number of slice encoding steps, and a number of slices is set up independently for the first, second, and third imaging schemes.

19. The apparatus of claim 16, wherein the control means also controls the pulse sequence such that an imaging region is set up independently for the first, second, and third imaging schemes.

20. The apparatus of claim 16, wherein the imaging means and the control means repeats an execution of the pulse sequence under a first condition in which a physiological function at the desired region of the body to be examined is inactive and under a second condition in which a physiological function at the desired region of the body to be examined is active, and the apparatus further comprises:

means for obtaining a physiological function image by applying subtraction/statistical processing on the second image data acquired by the second imaging scheme under the first and second conditions, while obtaining a blood vessel image from the first image data acquired by the first imaging scheme and a physical shape image from the third image data acquired by the third imaging scheme;

means for matching voxel sizes along reading, phase encoding, and slicing directions in the physiological function image, the blood vessel image, and the physical shape image obtained by the obtaining means; and means for displaying at least two of the physiological function image, the blood vessel image, and the physical shape image in superposition, by using the voxel sizes matched by the matching means.

\* \* \* \* \*